(12) United States Patent
Andresakis et al.

(10) Patent No.: US 6,657,849 B1
(45) Date of Patent: Dec. 2, 2003

(54) FORMATION OF AN EMBEDDED CAPACITOR PLANE USING A THIN DIELECTRIC

(75) Inventors: John A. Andresakis, Clifton Park, NY (US); Edward C. Skorupski, Stillwater, NY (US); Scott Zimmerman, Basking Ridge, NJ (US); Gordon Smith, Arlington Heights, IL (US)

(73) Assignee: Oak-Mitsui, Inc., Hoosick Falls, NY (US)

( * ) Notice: Subject to any disclaimer, the term of this patent is extended or adjusted under 35 U.S.C. 154(b) by 0 days.

(21) Appl. No.: 09/644,959

(22) Filed: Aug. 24, 2000

(51) Int. Cl.$^7$ ................................. H01G 4/06
(52) U.S. Cl. .............. 361/311; 361/313; 361/303; 361/305; 361/306.1
(58) Field of Search ............... 361/311, 312, 361/303, 308, 309, 310, 304, 305, 318, 306.1, 306.3, 313, 321.1

(56) References Cited

U.S. PATENT DOCUMENTS

| | | | |
|---|---|---|---|
| 3,638,086 A | 1/1972 | Rayburn | 317/260 |
| 4,731,695 A | 3/1988 | Brown et al. | 361/313 |
| 4,901,199 A * | 2/1990 | Foster | 361/308 |
| 5,031,029 A * | 7/1991 | Acocella et al. | 357/81 |
| 5,079,069 A | 1/1992 | Howard et al. | 428/209 |
| 5,155,655 A | 10/1992 | Howard et al. | 361/303 |
| 5,161,086 A | 11/1992 | Howard et al. | 428/209 |
| 5,185,689 A * | 2/1993 | Maniar | 361/313 |
| 5,626,906 A * | 5/1997 | Summerfelt et al. | 427/126 |
| 5,655,209 A * | 8/1997 | Casey et al. | 419/10 |
| 5,689,879 A * | 11/1997 | Urasaki et al. | 29/846 |
| 5,742,471 A * | 4/1998 | Barbee, Jr. et al. | 361/312 |
| 5,745,334 A * | 4/1998 | Hoffarth et al. | 361/313 |
| 5,796,587 A | 8/1998 | Lauffer et al. | |
| 5,870,274 A * | 2/1999 | Lucas | 361/311 |
| 6,068,782 A | 5/2000 | Brandt et al. | 216/17 |
| 6,200,852 B1 | 3/2001 | Lou et al. | 438/253 |
| 6,215,649 B1 * | 4/2001 | Appelt et al. | 361/312 |

FOREIGN PATENT DOCUMENTS

| | | |
|---|---|---|
| JP | 02-117118 A | 5/1990 |
| JP | 08-124797 A | 5/1996 |
| JP | 11-154734 A | 6/1999 |
| TW | 400647 | 8/2000 |

\* cited by examiner

Primary Examiner—Dean A. Reichard
Assistant Examiner—Nguyen T. Ha
(74) Attorney, Agent, or Firm—Roberts & Mercanti, LLP

(57) ABSTRACT

A capacitor, which has a pair of conductive foils each having a dielectric layer on its surface, wherein the dielectric layers are attached to one another. In one process for its production, a capacitor is formed by applying a first dielectric layer onto a surface of a first conductive foil; applying a second dielectric layer onto a surface of a second conductive foil; and then attaching the first and second dielectric layers to one another. The resulting capacitor exhibits excellent void resistance.

29 Claims, 2 Drawing Sheets

FORMATION OF AN EMBEDDED CAPACITOR PLANE USING A THIN DIELECTRIC

BACKGROUND OF THE INVENTION

1. Field of the Invention

This invention relates to polymeric capacitors. More particularly, this invention pertains to polymeric capacitors embedded within printed circuit boards or other microelectronic devices. The capacitor comprises a pair of parallel conductive foils separated by a dielectric. Each of the foils has a dielectric layer on its surface, and the dielectric layers are attached to one another. The capacitor exhibits excellent void resistance.

2. Description of the Related Art

A capacitor is a device used for introducing capacitance into a circuit, and functions primarily to store electrical energy, block the flow of direct current, or permit the flow of alternating current. They comprise a dielectric material sandwiched between two electrically conductive metal layers, such as copper foils.

In general, the dielectric material is coupled to the electrically conductive metal layers via an adhesive layer, by lamination, or by vapor deposition. U.S. Pat. No. 5,155,655 describes one method for forming a capacitor wherein a single sheet of a dielectric material is laminated together with two conductive foils. To optimize the performance of a capacitor, it is important that the dielectric material employed has good material properties exhibiting qualities such as superior adhesion, high dielectric strength and good flexibility.

Capacitors are common elements on printed circuit boards and other microelectronic devices. The capacitor is electrically connected either as a discrete element on the circuit board or may be embedded within the circuit board. Of these options, it has been preferred to form printed circuit boards having embedded capacitors to maximize the surface area of the circuit board for other purposes. The capacitance of a capacitor depends primarily on the shape and size of the capacitor layers and the dielectric constant of the insulating material. There are various known types of dielectric materials known in the art. For example, the dielectric material may be a gas, such as air, a vacuum, a liquid, a solid or a combination thereof. Each material has its own particular properties.

In forming capacitors for use in printed circuit boards, a dielectric material such as a glass reinforced polymer matrix has been used. However, the performance of capacitors of this type has been limited by factors such as the limited minimum thickness of the dielectric material, which detracts from the flexibility of the capacitor and attainable capacitance, the effect of bond enhancers on the metal foils, low dielectric constant and poor dielectric strength.

It is desirable to form a capacitor for a circuit board having a high dielectric constant and an extremely thin layer of dielectric material, thus increasing the capacitance and flexibility of the capacitor. However, a common problem frequently associated with such extremely thin dielectric layers is the formation of microscopic voids or other structural defects in the layer. For example, U.S. Pat. No. 5,161,086 provides a capacitor laminate having a single thin sheet of a dielectric material between two sheets of conductive foil. Dielectric layers of this type are highly vulnerable to the formation of voids, and are time consuming to detect and remedy.

The present invention provides a capacitor that solves the problems of the prior art. The capacitors of the present invention comprise a pair of conductive foils, a pair of thin dielectric layers, with one dielectric layer on a surface of each of the foils. The two conductive foils are pressed together such that the dielectric layers are attached to one another forming a single, homogeneous dielectric. By using two thin dielectric layers, any structural voids present in one of the individual dielectric is covered when the other dielectric is adjoined. The likelihood that each of the two dielectric layers has a void congruent with a void on the other dielectric layer is extremely remote. This increases the reliability and physical strength of the capacitor and eliminates a source of manufacturing flaws. Also, the thin dielectric layers allow for higher capacitance, greater heat conductivity and greater flexibility of the capacitor. The insulating dielectric preferably comprises a thermoplastic polymer or a thermosetting polymer having a high dielectric constant, high resistance to thermal stress and low moisture absorption. Together, these factors offer a significant improvement in performance and cost over prior art capacitors and printed circuit boards.

SUMMARY OF THE INVENTION

The invention provides a capacitor, which is comprised of a pair of electrically conductive foils, a pair of dielectric layers, one dielectric layer being on a surface of each of the foils and the dielectric layers being attached to one another.

The invention also provides a capacitor which comprises an electrically conductive foil, a first dielectric layer on a surface of the conductive foil, a second dielectric layer on the first dielectric layer and an electrically conductive layer on the second dielectric layer.

The invention still further provides a process for forming a capacitor which comprises applying a first dielectric layer onto a surface of a first conductive foil; applying a second dielectric layer onto a surface of a second conductive foil; and then attaching the first and second dielectric layers to one another. An optional reinforcement sheet maybe inserted between the first and second dielectric layer before attachment.

Also provided are capacitors wherein at least one conductive foil or conductive layer thereof comprises part of an electrical circuit, a chip carrier, a microelectronic device or printed circuit boards comprising the capacitors of the invention.

DETAILED DESCRIPTION OF THE PREFERRED EMBODIMENTS

Figure 1:
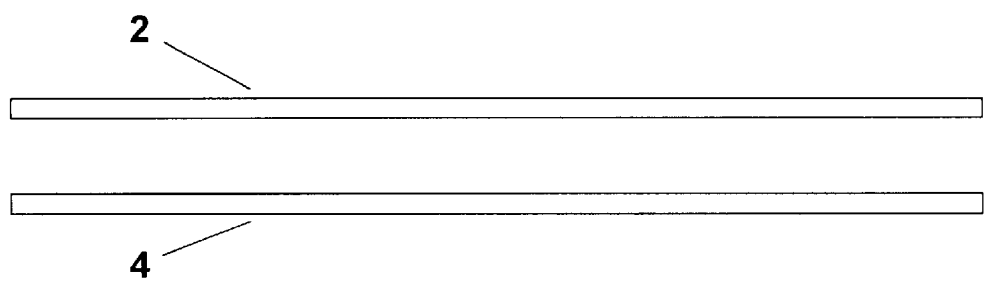
FIG. 1 is a schematic representation of a pair of uncoated conductive foils.
Figure 2:
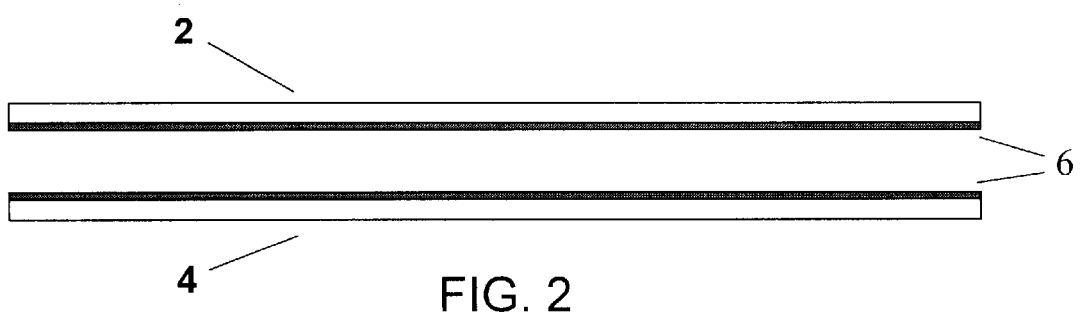
FIG. 2 is a schematic representation of a pair of foils, each having a layer of a dielectric material on the inner surface.

The invention provides a capacitor which comprises a pair of conductive foils, or a conductive foil and a conductive layer; and a pair of attached dielectric layers between the foils or the conductive foil and conductive layer. In a preferred embodiment, the invention provides a capacitor which comprises a pair of conductive foils and a pair of dielectric layers, with one dielectric layer being on a surface of each of the metal foils and the dielectric layers being attached to one another. Shown in FIG. 1 is a pair of conductive metal foils, 2 and 4, prior to application of a dielectric material. FIG. 2 illustrates each of foils 2 and 4 applied with a layer of a dielectric material 6. The dielectric material 6 is preferably directly coated onto each of the foils 2 and 4 forming a substantially uniform layer on a complete surface of each foil, as seen in FIG. 2.

One process by which the capacitors of this invention may be produced is by applying a liquid dielectric layer onto a surface of a conductive foil, wherein the liquid dielectric layer comprises a dielectric material and a solvent. Such coating may be done by unwinding web of conductive foil from a roll and then applying a continuous layer of the dielectric material onto a surface of the conductive foil. A metering device such as a doctor blade, slot-die, reverse roll or other may regulate the thickness of the dielectric layer. If the dielectric layers are prepared without a solvent, application techniques include melt extrusion in the case where the dielectric can be easily melted, and vapor deposition or sputtering in the case the dielectric can be easily vaporized and re-condensed.

In the case of foils prepared by electrodeposition, where one of the surfaces has a matte finish and the opposing side a shiny finish, the dielectric layer 6 may be coated onto either the shiny or matte surface of the foil. In the case where a strong bond between a dielectric layer and the conductive foil is desired, the dielectric may be applied to the matte side of the foil. In the case where a lower profile (less rough) surface is desired, the shiny surface of the foil can be mechanically or chemically treated to provide a more active surface to enhance the bond strength.

Figure 3:
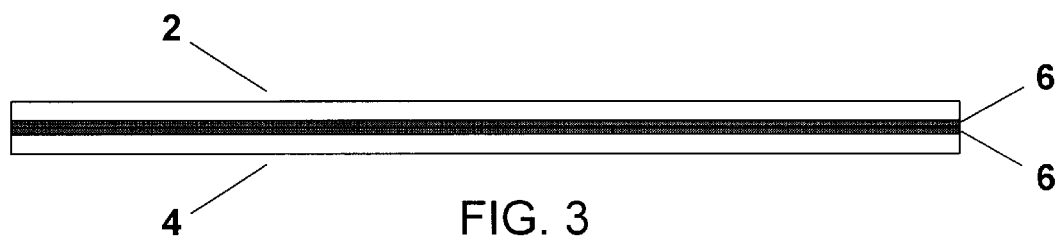
FIG. 3 is a schematic representation of a capacitor having a pair of attached dielectric layers.

Once the dielectric has been applied to foil and cut to the desired size, two foils are pressed together such that the dielectric layers are attached to one another thus forming a capacitor. This capacitor is shown in FIG. 3. After attaching the dielectric layers, the capacitor is then placed into an oven to evaporate residual solvent(s) from the dielectric material and either partially or fully cure the dielectric. Such may be done by subjecting the capacitor to a temperature of from about 100° F. to about 600° F., for about 1 to about 120 minutes. The dielectric may be fully or partially cured depending on the end use of the capacitor. After the desired degree of cure is completed, the capacitor is removed from the oven and cooled.

In an alternate embodiment, a capacitor may be formed by first applying a liquid dielectric material to a surface of a conductive foil and then curing the dielectric layer. Following curing of the first dielectric layer, a second layer of dielectric material is applied onto the first dielectric layer and then cured. After this second curing step, a conductive layer is then applied onto the second dielectric layer either as a foil or using sputtering, evaporation or vapor deposition techniques which are well known in the art.

The dielectric layers maybe also applied to the conductive foils in the form of solid sheets. In one embodiment, a first solid dielectric layer is laminated onto a surface of a first conductive foil, a second solid dielectric layer is then laminated onto a second conductive foil, and then the first and second dielectric layers are laminated to one another. Alternatively, a first conductive foil, a first solid dielectric sheet, a second solid dielectric sheet, and a second conductive foil are sandwiched together and laminated under heat and pressure. Lamination is preferably conducted in a press at a temperature of from about 210° C. to about 310° C., more preferably from about 230° C. to about 290° C. Lamination may be conducted for from about 1 minute to about 60 minutes, preferably from about 1 minutes to about 30 minutes. Preferably, the press is under a vacuum of at least 28 inches of mercury, and maintained at a pressure of about from about 100 psi to about 400, preferably from about 125 psi to about 300.

Each conductive foil or layer may comprise either the same metal or may comprise different metals. The conductive metals appropriate for the purposes of the present invention may vary depending on the desired application. The conductive foils or layers preferably comprise a material selected from the group consisting of copper, zinc, brass, chrome, chromates, titanium nitride, nickel, silanes, aluminum, stainless steel, iron, gold, silver, titanium and combinations and alloys thereof. Most preferably, the conductive foils and layers comprise a copper. In another preferred embodiment the conductive foils comprises a copper substrate and a metal layer on a surface of the copper substrate which metal layer comprises nickel, zinc or a combination of nickel and zinc. The conductive foils and layers preferably have a thickness of from about 0.5 to about 200 microns, more preferably from about 9 to about 70 microns. The conductive materials used in the capacitors of this invention may be manufactured with a shiny side surface and a matte surface. Examples of such conductive materials are disclosed in U.S. Pat. No. 5,679,230, which is incorporated herein by reference.

The dielectric material 6 is preferably formed from thermosetting polymers, thermoplastic polymers, inorganic compositions or a combination thereof. More particularly, the dielectric layers comprise a material selected from the group consisting of epoxies, polyesters, polyester containing copolymers, aromatic thermosetting copolyesters, polyarylene ethers and fluorinated polyarylene ethers available as Flare™ from Honeywell International Inc. of Sunnyvale, Calif., polyimides, benzocyclobutenes (available from Dow as Cyclotene), liquid crystal polymers (available from Kuraray), allylated polyphenylene ethers (available from Asahi Chemical), amines, inorganic materials such as barium titanate ($BaTiO_3$), boron nitride (BN), aluminum oxide ($Al_2O_3$), silica, strontium titanate, barium strontium titanate, quartz and other ceramic and non-ceramic inorganic materials and combinations thereof. Aromatic thermosetting copolyesters include those described in U.S. Pat. Nos. 5,439,541 and 5,707,782. Of these materials, the most preferred dielectric is a liquid polyimide polymer or a mixture of polyimide polymers. The dry, solid dielectric layer may comprise about 100% of any of the above compounds or may comprise mixtures of these or may contain other additives.

Polyimides have high electrical strengths, good insulating properties, a high softening point and are inert to many chemicals. Preferred polyimides will have a glass transition temperature (Tg) of from about 160° C. to about 320° C. with a glass transition temperature of from about 190–270° C. being preferred. When the dielectric layers comprise polymeric materials, they may also optionally comprise a filler material. Preferred fillers non-exclusively include barium titanate ($BaTiO_3$), boron nitride, aluminum oxide, silica, strontium titanate, barium strontium titanate, quartz and other ceramic and non-ceramic fillers and combinations thereof. If incorporated, a filler is preferably present in a dielectric material in an amount of from about 5% to about 80% by volume of the dielectric material, more preferably from about 10% to about 50% by volume of the dielectric material. In addition, either one or both of the dielectric layers may contain a dye or pigment to impart color, alter dielectric opacity or affect contrast.

The dielectric layers are preferably applied to the conductive foils as liquid polymer solutions to allow for control and uniformity of the polymer thickness. The solution will typically have a viscosity ranging from about 5,000 to about 35,000 centipoise with a preferred viscosity in the range of 15,000 to 27,000 centipoise. The polymer solution will include from about 10 to about 60% and preferably 15 to 30 wt % polymer with the remaining portion of the solution comprising one or more solvents. It is preferred that a single solvent be used in the polymer solution. Useful solvents include acetone, methyl-ethyl ketone, N-methyl pyrrolidone, N,N dimethylformamide, N,N dimethylacetamide and mixtures thereof. A most preferred single solvent is N- methyl pyrrolidone.

Preferably, the dielectric layers have a thickness of from about 2 to about 200 microns, more preferably from about 2 to about 100 microns. Preferably the dielectric layers have a dielectric strength of at least about 2000 volts per mil thickness, preferably from about 2000 to about 10,000 volts per mil thickness and more preferably from about 2000 to about 6000 volts per mil thickness.

Figure 4:
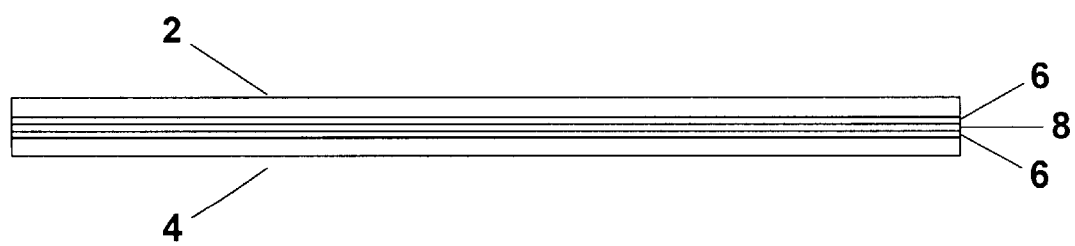
FIG. 4 is a schematic representation of a capacitor having a reinforcing layer between a pair of dielectric layers.

FIG. 4 illustrates another preferred embodiment of the invention wherein the capacitor further incorporates a reinforcing layer 8 in the dielectric layer. The purpose of the reinforcing layer 8 is to reduce dimensional changes, particularly in the X,Y planes, resulting from thermal excursions and chemical processing. If incorporated, this reinforcing layer would be introduced prior to attaching the two coated foils 2 and 4, and laminated together with each layer of foil and dielectric material. Preferred materials for the reinforcing layer non-exclusively include fiberglass cloth, aramid paper, polybenzoxolate (PBO) paper, polybenzoxolate fiber or combinations thereof. The preferred thickness of the reinforcing layer is of from about 5 to about 200 microns, more preferably from about 10 to about 50 microns.

In the preferred embodiment of the invention, the preferred capacitance of the capacitor is at least about 250 pF/cm$^2$, more preferably from about 250 to about 40,000 pF/cm$^2$. The capacitors of this invention may be used in a variety of printed circuit applications. For example, they may be coupled with or embedded within rigid, flexible or in rigid/flexible electrical circuits, printed circuit boards or other microelectronic devices such as chip packages. Generally, they are used by creating a first circuit pattern on the conductive foil layer. A second circuit pattern may be applied to the polymer surface either in the form of a conductive foil, by electrodeposition, by sputtering, by vapor phase deposition or some other means. In addition, it may be necessary to generate vias in the capacitor to electrically connect opposing circuit layers. Furthermore, the use of the capacitors will depend upon whether the dielectric layer is partially or fully cured.

Once a capacitor has been formed, circuit patterns may also be created in the conductive foil layer using known etching techniques. In etching, a layer of photoimageable resist or liquid material is applied to the conductive foil layer. Using a negative photo pattern, which is overlaid on the resist, the photoresist is exposed to actinic radiation creating a desired circuit pattern. The imaged capacitor is then exposed to film developing chemistry that selectively removes the unwanted unexposed portions. The capacitor with circuit image is then contacted with known chemical etchant baths to remove the exposed conductive layer, leaving the final desired conductive patterned capacitor. Also, each conductive metal layer may optionally be electrically connected by forming a hole through the entire capacitor and filling it with a conductive metal. Lamination steps are preferably conducted at a minimum of 275° C. This will result in a uniform, thin dielectric layer of from about 8 to about 12 microns total dielectric thickness with essentially no voids. The resulting laminate is flexible and can be readily processed. If a defect in coating should occur, the coating on the other piece of conductive foil will still insure performance. The capacitor may form a part of a printed circuit board, a part of a carrier for a microelectronic device such as a chip.

The following non-limiting examples serve to illustrate the invention.

EXAMPLE 1

A roll of electrodeposited 35 micron, one ounce copper foil, 0.64 meters in width is mounted on an unwind roller. A sample of the foil is taken as a 0.3 m×0.3 m cut and weighed to establish the foil base weight. The foil is threaded through tensioning rollers and into an oven, through idler rollers, and onto a rewind roller. The foil is then tensioned to 4 pounds per inch width. IR heat sources in the oven are set at 150° C., 232° C. and 316° C. in three different zones and allowed to stabilize. A drive motor on the rewind roller is engaged and set to 1.2 meters/minute. Edge guides are enabled and proper tracking through the oven is confirmed. A liquid polyimide resin is adjusted to 25% solids, a viscosity of about 20,000 centipose, with N-methylpyrrolidone in a stainless steel mixing vat. The polyimide solution is supplied to a dispensing system and a film of approximately 50 microns is applied to the shiny side of the moving foil using gravity and the liquid polymer viscosity as dispensing forces.

A doctor blade is adjusted to produce a wet film of 43 microns in thickness, resulting in a flexible composite having a dried polymer film in thickness of about 7.6 microns. A continuous liquid head height and volume of dammed material is maintained on the upstream side of the doctor blade to maintain a constant flexible composite film thickness and a film free of included air bubbles.

The solvent is evaporated off and the polymer is cured in an oven. As the coated foil first enters the oven, an initial temperature drop should be anticipated. Once steady state temperatures are achieved in the oven, film thickness is checked by taking a foil sample and comparing the coated weight to the base weight of the foil using the polyimide density to convert from weight to film thickness. Adjustments to the rate of polyimide dispensed and or doctor blade height over the foil are made based on this measurement. This process is repeated until the desired film thickness is attained. A capacitor is formed by laminating two pieces of this coated foil in a hydraulic press at 275° C. and 150 psi for 30 minutes. The press is under vacuum of 28 inches of mercury.

The capacitor produced by this method includes two metal foil layers with semi-cured polyimide containing 2–3% residual solvent. The capacitor is cut to size and processed to impart a pattern in the copper. The resulting capacitor "core" is visually inspected and then electrically tested for shorting at 500 volts. Resulting capacitor layers will have a capacitance of at least 250 pF/cm$^2$ and a dielectric breakdown voltage of at least 2000 volts/mil.

EXAMPLE 2

Example 1 is repeated except the polymer is loaded with 50 volume % barium titanate (BaTiO$_3$). Capacitance is increased to at least 2.0 nF/cm² with at least 1000 volts/mil dielectric breakdown voltage.

EXAMPLE 3

Example 1 is repeated except a 10 micron sheet of p-phenylene-2,6-benzobisoxazole paper is laminated between the polyimide surfaces of the coated copper. Resulting product has improved dimensional stability and tear resistance. Capacitance is at least 100 pF/cm² and a dielectric breakdown voltage is at least 2500 volts/mil.

EXAMPLE 4

Example 3 is repeated except the polyimide is loaded with 50 volume % barium titanate. Capacitance is at least 500 pF/cm² and a dielectric breakdown voltage is at least 1500 volts/mil.

EXAMPLE 5

Example 2 is repeated except boron nitride is used as the fill material. Capacitance is at least 325 pF/cm² with a breakdown voltage of at least 1000 volts/mil.

EXAMPLE 6

Example 1 is repeated except lamination is done using a continuous hot roll lamination process at 300° C. and 300 psi). The product is subjected to a post lamination oven bake to achieve final cure.

EXAMPLE 7

Example 1 is repeated except coating is done with an extrusion coater and lamination is done by a nip roller process. A filler is coextruded with the polyimide.

EXAMPLE 8

Example 1 is repeated except the shiny side of the foil is treated with nodules to improve mechanical adhesion to the polyimide. Maximum nodule size is less than 120 micro inches to avoid the possibility of high potential failures.

EXAMPLE 9

Example 4 is repeated except that nanofibers (such as PBO) are incorporated into the polyimide at up to 30 volume %. This improves the dimensional stability and tear resistance. The nanofiber pulp is processed along with the polyimide using a mechanical method to break down the fibers (such as a ball mill). Barium titanate is mixed in with another part of the polyimide using a high shear mixture. The two components are added together and mixed using a low shear mixer. The polyimide with the two fillers are then coated using the method of example 1.

EXAMPLE 10

A sample of one ounce copper foil is treated on a matte side of the foil by the addition of copper nodules that are subsequently encapsulated. A layer of zinc chromate is applied to both the matte and shiny. To the matte side an organic layer is applied to prevent spots and gamma-aminopropyl triethoxy silane is applied to the shiny side to promote adhesion to the polyimide.

A polyimide resin that is dissolved in N-methyl pyrrolidinone (NMP) is applied to the shiny side. A blade coater delivers a uniform coating free of bubbles. The solvent is evaporated off, and the resin is cured in an oven. Two pieces of this coated foil are laminated in a hydraulic press at 275° C. and 150 psi for 30 minutes. The press is under vacuum of at least 28 inches of mercury. The resulting laminate is cut to size and processed through known manufacturing techniques to impart a specific pattern in the copper for the capacitors. This is done by the surface preparation of the copper by acid clean and water rinse, and application of a photosensitive resist. A desired pattern is used in a UV exposure unit to expose the resist. With a negative working resist the exposed area is crosslinked and will not be developed away and will protect the copper during etching. After developing by sodium carbonate and etching in cupric chloride, the resist is stripped away using potassium hydroxide leaving the desired copper pattern. The resulting capacitor core is visually inspected and then electrically tested for shorting. This high potential testing is done at 500 volts DC.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A capacitor, which is comprised of a pair of electrically conductive foils comprising a copper substrate and a metal layer on a surface of the copper substrate which metal layer comprises nickel, a pair of dielectric layers, one dielectric layer being on a surface of each of the metal layers and substantially the entirety of the dielectric layers being attached to one another.

2. The capacitor of claim 1 wherein the dielectric layers have a dielectric strength of at least about 2000 volts per mil thickness.

3. The capacitor of claim 1 wherein the dielectric layers comprise a material selected from the group consisting of thermosetting polymers, thermoplastic polymers, inorganic materials, and combinations thereof.

4. The capacitor of claim 1 wherein the dielectric layers comprise a material selected from the group consisting of epoxies, polyesters, polyester containing copolymers, polyarylene ethers, fluorinated polyarylene ethers, polyimides, benzocyclobutenes, liquid crystal polymers, allylated polyphenylene ethers, amines, and combinations thereof.

5. The capacitor of claim 1 wherein at least one of the dielectric layers comprises about 100% of an inorganic material.

6. The capacitor of claim 1 wherein at least one of the dielectric layers comprises about 100% of an inorganic material selected from the group consisting of ceramics, barium titanate, boron nitride, aluminum oxide, silica, strontium titanate, barium strontium titanate, quartz, and combinations thereof.

7. The capacitor of claim 1 wherein the composition of at least one of the dielectric layers is comprised of a polymer and a filler.

8. The capacitor of claim 7 wherein the filler in the dielectric is selected from the group consisting of ceramics, barium titanate, boron nitride, aluminum oxide, silica, strontium titanate, barium strontium titanate, quartz, nonceramic fillers and combinations thereof.

9. The capacitor of claim 1 wherein at least one of the dielectric layers is comprised of a filler and a polymer wherein the filler is present in an amount of from about 5% to about 80% by volume of the dielectric layer.

10. The capacitor of claim 1 wherein each of the conductive foils has a thickness of from about 0.5 to about 200 microns.

11. The capacitor of claim 1 wherein each of the dielectric layers has a thickness of from about 2 to about 200 microns.

12. The capacitor of claim 1 wherein a reinforcing layer is incorporated in the dielectric layer.

13. The capacitor of claim 1 further comprising a reinforcing layer in the dielectric layer, which reinforcing layer comprises fiberglass, paper, polybenzoxolate paper, or combinations thereof.

14. The capacitor of claim 1 which has a capacitance of at least about 250 pF/cm$^2$.

15. The capacitor of claim 1 in which at least one of the conductive foils comprises a part of an electrical circuit.

16. A printed circuit board which comprises the capacitor of claim 1.

17. A chip carrier for a microelectronic device which comprises the capacitor of claim 1.

18. The capacitor of claim 1 wherein the dielectric layer comprises a polyimide.

19. A capacitor which comprises an electrically conductive foil comprising a copper substrate and a metal layer on a surface of the copper substrate which metal layer comprises nickel, a first dielectric layer on a surface of the metal layer, a second dielectric layer on substantially the entirely of the first dielectric layer and an electrically conductive layer on the second dielectric layer.

20. The capacitor of claim 19 wherein the conductive layer is applied on the second dielectric layer by sputtering, evaporation or vapor deposition.

21. The capacitor of claim 19 wherein the conductive layer comprises a foil.

22. The capacitor of claim 19 in which at least one of the conductive foil or conductive layer comprises a part of an electrical circuit.

23. A printed circuit board which comprises the capacitor of claim 19.

24. A chip carrier for a microelectronic device which comprises the capacitor of claim 19.

25. A process for forming a capacitor which comprises providing a first and a second electrically conductive foil, each conductive foil comprising a copper substrate and a metal layer on a surface of the copper substrate which metal layer comprises nickel; applying a first dielectric layer onto a surface of the metal layer of the first conductive foil; applying a second dielectric layer onto a surface of the metal layer of the second conductive foil and then attaching substantially the entirety of the first and second dielectric layers to one another.

26. The process of claim 25 wherein the first and second dielectric layers are applied as liquids onto the first and second conductive foils.

27. The process of claim 25 wherein the first and second dielectric layers are applied as liquids onto the first and second conductive foils and then at least partially dried.

28. The process of claim 25 wherein the first and second dielectric layer are in the form of sheets which are laminated to the first and second conductive foils.

29. The process of claim 25 wherein the first and second dielectric layer are attached to one another by lamination.

* * * * *